United States Patent
Sai (10) Patent No.: US 10,032,762 B1
(45) Date of Patent: Jul. 24, 2018

(54) SEMICONDUCTOR DEVICE

(71) Applicant: KABUSHIKI KAISHA TOSHIBA, Tokyo (JP)

(72) Inventor: Hideaki Sai, Ibo Hyogo (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 15/688,529

(22) Filed: Aug. 28, 2017

(30) Foreign Application Priority Data

Mar. 23, 2017 (JP) .................................. 2017-058156

(51) Int. Cl.
| | |
|---|---|
| *H01L 27/02* | (2006.01) |
| *H01L 29/866* | (2006.01) |
| *H01L 29/06* | (2006.01) |
| *H01L 27/08* | (2006.01) |

(52) U.S. Cl.
CPC ...... *H01L 27/0248* (2013.01); *H01L 27/0255* (2013.01); *H01L 27/0814* (2013.01); *H01L 29/0646* (2013.01); *H01L 29/866* (2013.01)

(58) Field of Classification Search
None
See application file for complete search history.

(56) References Cited

U.S. PATENT DOCUMENTS

| | | |
|---|---|---|
| 2014/0070367 A1 | 3/2014 | Kawase et al. |
| 2015/0002967 A1 | 1/2015 | Kawase et al. |
| 2016/0056142 A1 | 2/2016 | Kaida |
| 2016/0093605 A1* | 3/2016 | Sai ...................... H01L 27/0255 |
| | | 257/491 |

FOREIGN PATENT DOCUMENTS

| | | |
|---|---|---|
| JP | 2012-146717 A | 8/2012 |
| JP | 2012182381 A | 9/2012 |
| JP | 2014067986 A | 4/2014 |
| JP | 2015012184 A | 1/2015 |
| JP | 2015126149 A | 7/2015 |
| JP | 2015179776 A | 10/2015 |
| JP | 2016046383 | 4/2016 |

* cited by examiner

*Primary Examiner* — Minh-Loan Tran
(74) *Attorney, Agent, or Firm* — Patterson & Sheridan, LLP (57) ABSTRACT

A semiconductor device includes a first diode having a cathode connected to a first terminal, a second diode having a cathode connected to a second terminal and an anode connected to an anode of the first diode, a third diode having an anode connected to the first terminal and the cathode of the first diode, a fourth diode having an anode connected to the second terminal and the anode of the second diode and a cathode connected to a cathode of the third diode, and a fifth diode having an anode connected to the anode of the first diode and the anode of the second diode and a cathode connected to the cathode of the third diode and the fourth diode. A breakdown voltage of the fifth diode is lower than the breakdown voltages of the first diode, the second diode, the third diode, and the fourth diode.

20 Claims, 9 Drawing Sheets

SEMICONDUCTOR DEVICE

CROSS-REFERENCE TO RELATED APPLICATION

This application is based upon and claims the benefit of priority from Japanese Patent Application No. 2017-058156, filed Mar. 23, 2017, the entire contents of which are incorporated herein by reference.

FIELD

Embodiments described herein relate generally to semiconductor devices.

BACKGROUND

A protective diode for protecting an integrated circuit from electrostatic discharge (ESD) is commonly employed. However, it is desirable to provide such a protective diode at reduced cost.

DETAILED DESCRIPTION

In general, according to one embodiment, a semiconductor device includes: a first diode having a cathode connected to a first terminal, a second diode having a cathode connected to a second terminal and an anode connected to an anode of the first diode, a third diode having an anode connected to the first terminal and the cathode of the first diode, a fourth diode having an anode connected to the second terminal and the anode of the second diode and a cathode connected to a cathode of the third diode, and a fifth diode having anode connected to the anode of the first diode and the anode of the second diode and a cathode connected to the cathode of the third diode and the cathode of the fourth diode. A breakdown voltage of the fifth diode is lower than a breakdown voltage of each of the first diode, the second diode, the third diode, and the fourth diode.

According to another embodiment, a semiconductor device includes: a first diode having a cathode connected to a first terminal, a second diode having a cathode connected to a second terminal, a third diode having a cathode connected to the first terminal and an anode connected to an anode of the second diode and a capacitance that is lower than a capacitance of the second diode, and a fourth diode having a cathode connected to the second terminal and an anode connected to an anode of the first diode and a capacitance that is lower than a capacitance of the first diode.

First Embodiment

Figure 1:
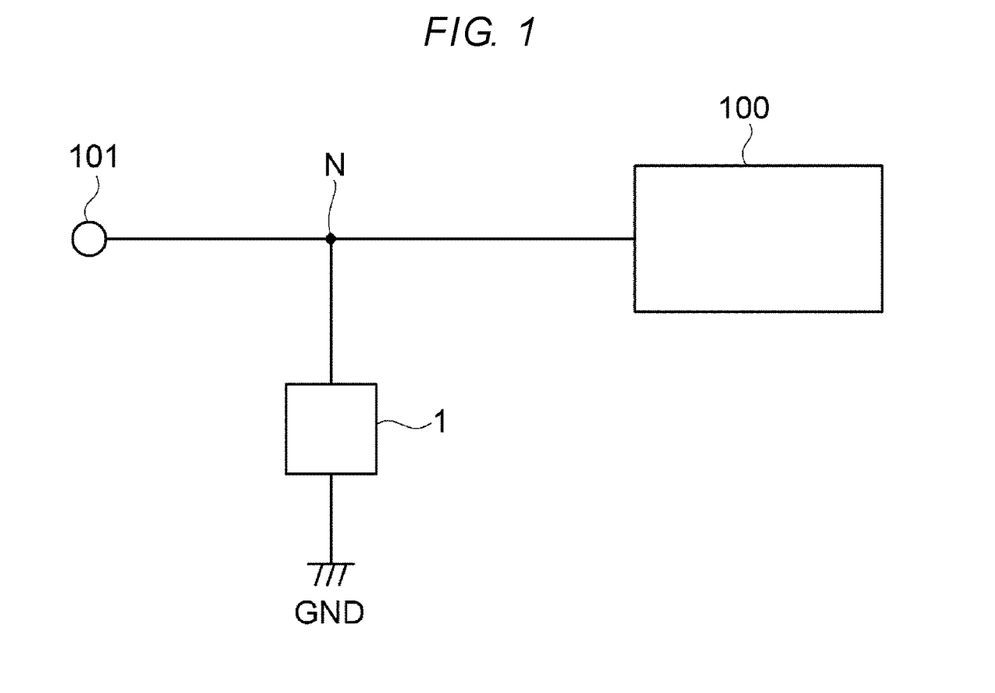
FIG. 1 is a circuit diagram depicting an example of how a semiconductor device according to a first embodiment can be used.

FIG. 1 is a circuit diagram depicting an example of how a semiconductor device according to the first embodiment can be used.

Figure 2:
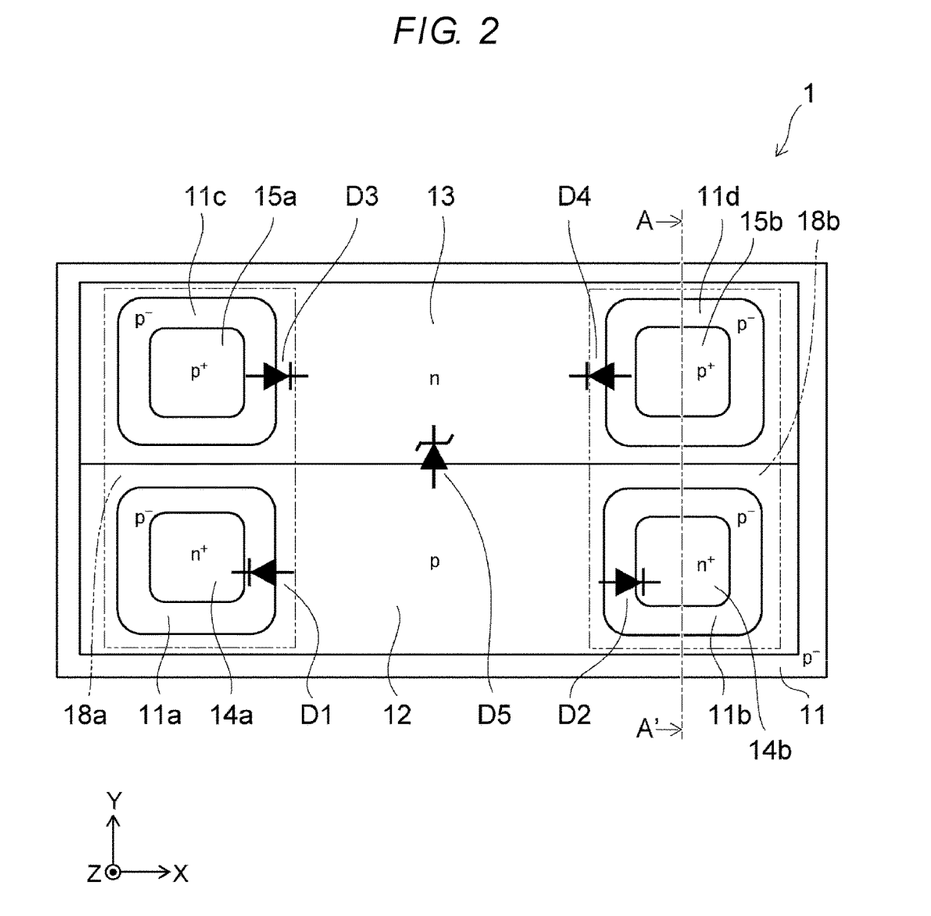
FIG. 2 is a plan view depicting a semiconductor device according to the first embodiment.

FIG. 2 is a plan view depicting the semiconductor device according to the first embodiment.

Figure 3:
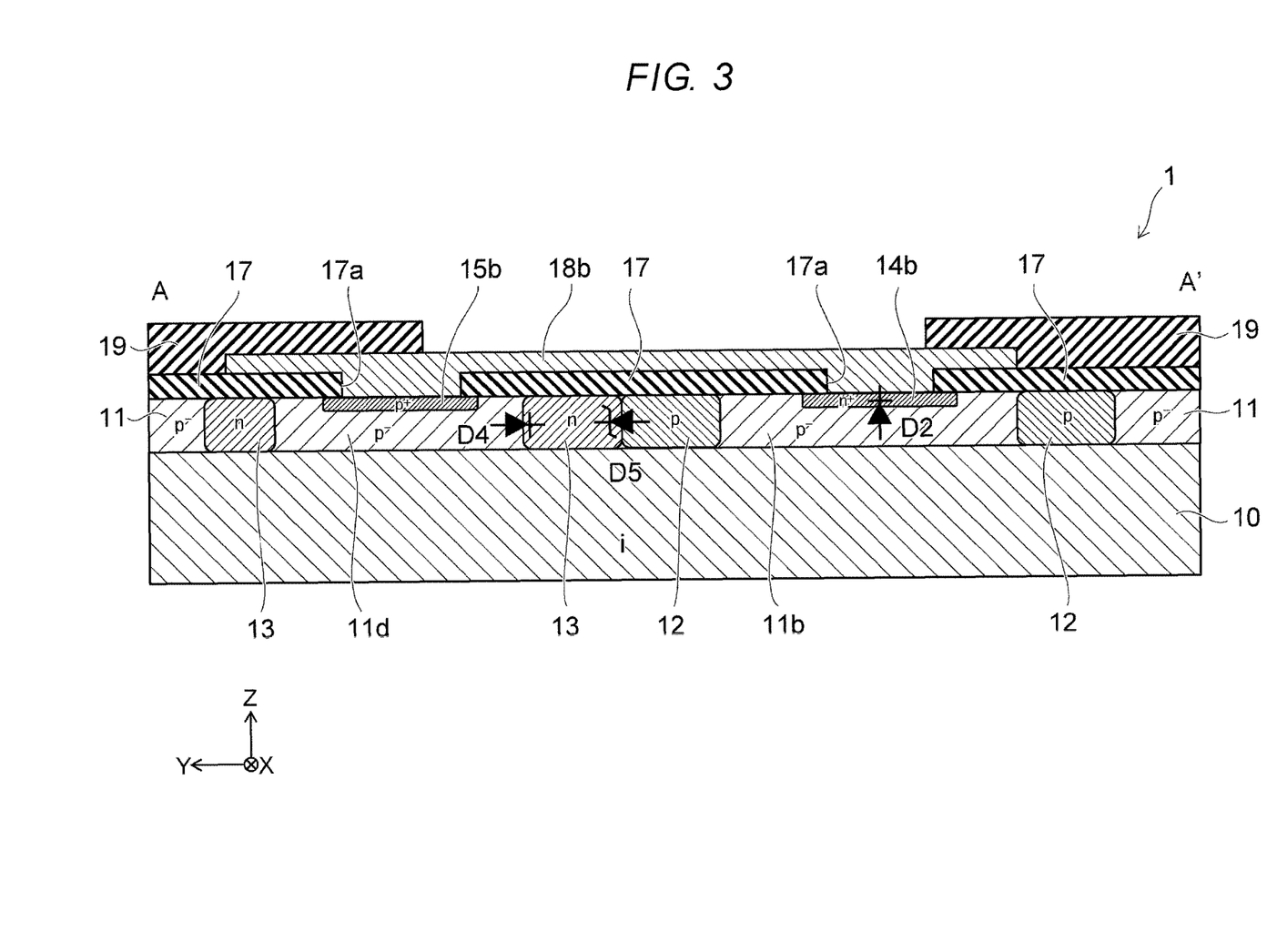
FIG. 3 is a cross-sectional view taken along the line A-A' depicted in FIG. 2.

FIG. 3 is a cross-sectional view taken along the line A-A' depicted in FIG. 2.

Figure 4:
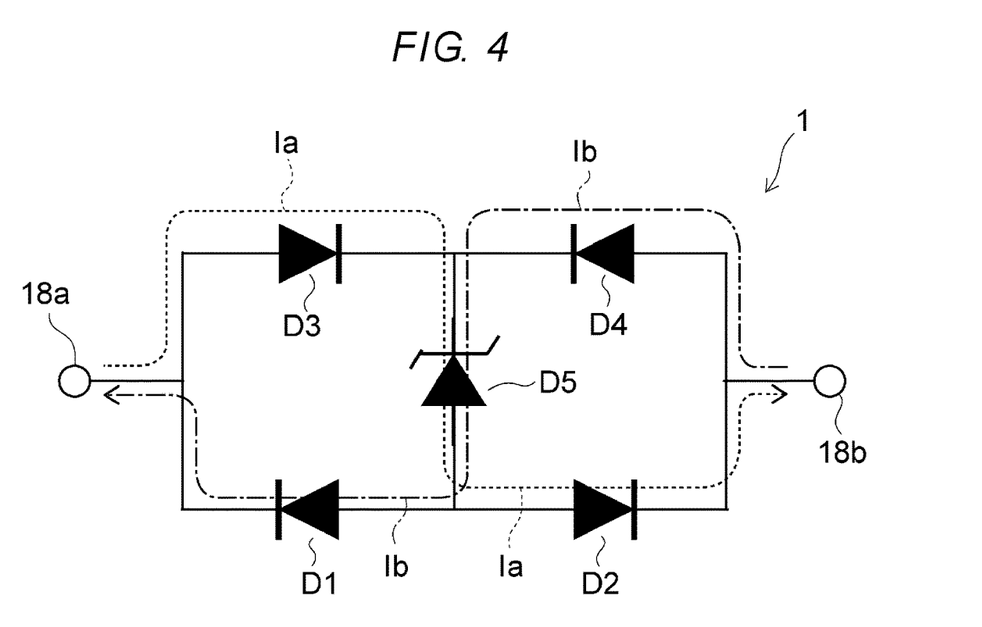
FIG. 4 is a circuit diagram depicting the semiconductor device according to the first embodiment.

FIG. 4 is a circuit diagram depicting the semiconductor device according to the first embodiment.

As depicted in FIG. 1, a semiconductor device 1 is used as a protective circuit. The semiconductor device 1 is connected between a node N and a reference potential, for example, a ground potential GND. The node N is located between a protected circuit 100 and an external terminal 101. The semiconductor device 1 allows high-voltage noise, such as ESD, input at the external terminal 101 to pass to the ground potential GND and thereby functions to protect the protected circuit 100 from high-voltage noise.

As depicted in FIGS. 2 and 3, an i-type substrate 10 is provided in the semiconductor device 1. In the i-type substrate 10, the conductivity type of at least an upper-layer portion is i-type (intrinsic semiconductor). The i-type substrate 10 is formed of, for example, a single crystal of undoped silicon.

Hereinafter, in the present specification, for the sake of explanation, an XYZ Cartesian coordinate system is adopted. Directions that are parallel to the upper surface of the i-type substrate 10 and intersect at right angles to each other are assumed to be an "X direction" and a "Y direction". A direction orthogonal to the upper surface of the i-type substrate 10 is assumed to be a "Z direction". One direction along the Z direction may also be referred to as an "upper" direction (or side) and the opposite direction along the Z direction may also be referred to as a "lower" direction (or side), but these expressions are for descriptive purposes and do not necessarily correspond to the direction of gravity. Moreover, in the present specification, expressions: a "p-type", an "n-type", and an "i-type" denote conductivity types, and a "$p^+$-type" indicates that this type contains a higher concentration of impurities acting as acceptors than the "p-type" and a "$p^-$-type" indicates that this type contains a lower concentration of impurities acting as acceptors than the "p-type". Likewise, an "$n^+$-type" indicates that this type contains a higher concentration of impurities acting as donors than the "n-type" and an "$n^-$-type" indicates that this type contains a lower concentration of impurities acting as donors than the "n-type".

On i-type substrate 10, a $p^-$-type epitaxial layer 11 is provided. The $p^-$-type epitaxial layer 11 is a layer formed, for example, by epitaxially growing silicon on the upper surface of the i-type substrate 10. In the $p^-$-type epitaxial layer 11, a p-type well 12 and an n-type well 13 are provided. The p-type well 12 and the n-type well 13 are adjacent in the Y direction and are in contact with each other. The lower surfaces of the p-type well 12 and the n-type well 13 are in contact with the i-type substrate 10, and the upper surfaces of the p-type well 12 and the n-type well 13 reach the upper surface of the $p^-$-type epitaxial layer 11.

In the p-type well 12, two openings are formed and spaced from each other in the X direction. The insides of these two openings have p⁻-type epitaxial layers 11a and 11b therein, respectively. Likewise, in the n-type well 13, two openings are formed and spaced from each other in the X direction. The insides of these two openings have p⁻-type epitaxial layers 11c and 11d therein, respectively. The lower surfaces of the p⁻-type epitaxial layers 11a, 11b, 11c, and 11d are in contact with the i-type substrate 10.

In an upper portion of the central part of the p⁻-type epitaxial layer 11a, an n⁺-type contact layer 14a is provided, and, in an upper portion of the central part of the p⁻-type epitaxial layer 11b, an n⁺-type contact layer 14b is provided. In an upper portion of the central part of the p⁻-type epitaxial layer 11c, a p⁺-type contact layer 15a is provided, and, in an upper portion of the central part of the p⁻-type epitaxial layer 11d, a p⁺-type contact layer 15b is provided. The p⁻-type epitaxial layer 11a is in contact with the n⁺-type contact layer 14a, the p⁻-type epitaxial layer 11b is in contact with the n⁺-type contact layer 14b, the p⁻-type epitaxial layer 11c is in contact with the p⁺-type contact layer 15a, and the p⁻-type epitaxial layer 11d is in contact with the p⁺-type contact layer 15b.

On the p⁻-type epitaxial layer 11, an insulating film 17 is provided. In the insulating film 17, openings 17a are formed in four places, and the n⁺-type contact layers 14a and 14b and the p⁺-type contact layers 15a and 15b are respectively exposed through these four openings 17a. On the insulating film 17, electrodes 18a and 18b are provided so as to be separated from each other in the X direction. The electrode 18a is connected to the n⁺-type contact layer 14a via an opening 17a of the insulating film 17 and the p⁺-type contact layer 15a via another opening 17a of the insulating film 17. Similarly, the electrode 18b is connected to the n⁺-type contact layer 14b and the p⁺-type contact layer 15b via two other openings 17a of the insulating film 17.

On the insulating film 17, an insulating film 19 is provided so as to cover the peripheries (outer edge portions) of the electrodes 18a and 18b. The central parts of the electrodes 18a and 18b are not covered with the insulating film 19 and serve as pads to be connected to the outside. It is to be noted that, in FIG. 2, for the purpose of illustration, the insulating films 17 and 19 have been omitted from the depiction.

Next, an operation of the semiconductor device 1 according to the first embodiment will be described.

As depicted in FIGS. 2 and 3, a diode D1 whose anode is the p⁻-type epitaxial layer 11a and whose cathode is the n⁺-type contact layer 14a is formed at the interface between the p⁻-type epitaxial layer 11a and the n⁺-type contact layer 14a. A diode D2 whose anode is the p⁻-type epitaxial layer 11b and whose cathode is the n⁺-type contact layer 14b is formed at the interface between the p⁻-type epitaxial layer 11b and the n⁺-type contact layer 14b.

A diode D3 whose anode is the p⁻-type epitaxial layer 11c and whose cathode is the n-type well 13 is formed at the interface between the p⁻-type epitaxial layer 11c and the n-type well 13. A diode D4 whose anode is the p⁻-type epitaxial layer 11d and whose cathode is the n-type well 13 is formed at the interface between the p⁻-type epitaxial layer 11d and the n-type well 13. A diode D5 whose anode is the p-type well 12 and whose cathode is the n-type well 13 is formed at the interface between the p⁻-type epitaxial layer 11d and the n-type well 13.

As a result, a figure-eight crowbar circuit (as depicted in FIG. 4) corresponds to an equivalent circuit for the semiconductor device 1. In this circuit, the electrodes 18a and 18b and the diodes D1 to D5 are provided. The cathode of the diode D1 and the anode of the diode D3 are connected to the electrode 18a. The cathode of the diode D2 and the anode of the diode D4 are connected to the electrode 18b. The cathode of the diode D3 is connected to the cathode of the diode D4. The anode of the diode D1 is connected to the anode of the diode D2. In addition, the anode of the diode D5 is connected to the anode of the diode D1 and the anode of the diode D2, and the cathode of the diode D5 is connected to the cathode of the diode D3 and the cathode of the diode D4.

Between the electrode 18a and the electrode 18b, a current path that passes through all the diodes in a forward direction does not exist, and any current that passes between these two electrodes must pass through at least one diode in a reverse direction. While the anodes of the diodes D1 to D4 are the p⁻-type epitaxial layers 11a, 11b, 11c, and 11d, respectively, the anode of the diode D5 is the p-type well 12. As a result, the depletion layer of the diode D5, which is formed at the time of reverse junction, is narrow and therefore the capacitance is large and the breakdown voltage is low. Thus, the semiconductor device 1 can be designed so that the diode D5 breaks down first when a voltage is applied between the electrode 18a and the electrode 18b.

As a result, when a voltage generated with the electrode 18a being used as a positive electrode and the electrode 18b as a negative electrode is applied, a current flows along a current path Ia: {the electrode 18a→the diode D3 (forward direction)→the diode D5 (reverse direction)→the diode D2 (forward direction)→the electrode 18b}. On the other hand, when a voltage generated with the electrode 18b being used as a positive electrode and the electrode 18a as a negative electrode is applied, a current flows along a current path Ib: {the electrode 18b→the diode D4 (forward direction)→the diode D5 (reverse direction)→the diode D1 (forward direction)→the electrode 18a}.

As described above, in both the current paths Ia and Ib, since a current passes only through the diode D5 in the reverse direction, the breakdown voltage of the semiconductor device 1 depends on the breakdown voltage of the diode D5. The breakdown voltage of the diode D5 can be controlled by adjusting the impurity concentrations of the p-type well 12 and the n-type well 13.

Furthermore, in the current path Ia, since the diode D3, the diode D5, and the diode D2 are connected in series between the electrode 18a and the electrode 18b, the large capacitance of the diode D5 is not visible from the outside. Likewise, in the current path Ib, since the diode D4, the diode D5, and the diode D1 are connected in series between the electrode 18b and the electrode 18a, the large capacitance of the diode D5 is not visible from the outside. As a result, the effective capacitance of the whole of the semiconductor device 1 is small and the influence thereof on a signal flowing between the external terminal 101 and the protected circuit 100 depicted in FIG. 1 will also be small.

Next, the effect of the first embodiment will be described.

In the semiconductor device 1 according to the first embodiment, the bidirectional current paths Ia and Ib can be provided in one chip. As a result, a bidirectional protective circuit can be provided at low cost and in small space. Moreover, the capacitance of the whole of the semiconductor device 1 can reduced by connecting the diode D5 (having a large capacitance) and in series with the other diodes.

Moreover, in the semiconductor device 1, since both the electrodes 18a and 18b are disposed on the upper surface of the i-type substrate 10, a land grid array (LGA) package type can be provided.

Furthermore, both the current paths Ia and Ib pass through the p⁻-type epitaxial layer 11 and an impurity region formed therein and make virtually no entry into the i-type substrate 10. That is, the current paths Ia and Ib extend in a horizontal direction and hardly extend in a vertical direction (the Z direction). As a result, the current path is short and the dynamic resistance is low, which allows ESD currents to escape effectively.

In addition, the semiconductor device 1 according to the first embodiment can be produced by forming the p-type well 12, the n-type well 13, the n⁺-type contact layers 14a and 14b, and the p⁺-type contact layers 15a and 15b by ion implantation, for example, on a base material obtained by epitaxially growing the p⁻-type epitaxial layer 11 on the i-type substrate 10, and then forming the insulating film 17, the electrodes 18a and 18b, and the insulating film 19. Thus, when the semiconductor device 1 is produced, there is no need to perform processing steps with a high degree of difficulty, such as performing an epitaxial growth after the formation of a diffusion layer. As a result, the semiconductor device 1 can be produced with high productivity and short turn-around time (TAT). Therefore, the production cost of the semiconductor device 1 is low.

Modified Example of the First Embodiment

Next, a modified example of the first embodiment will be described.

Figure 5:
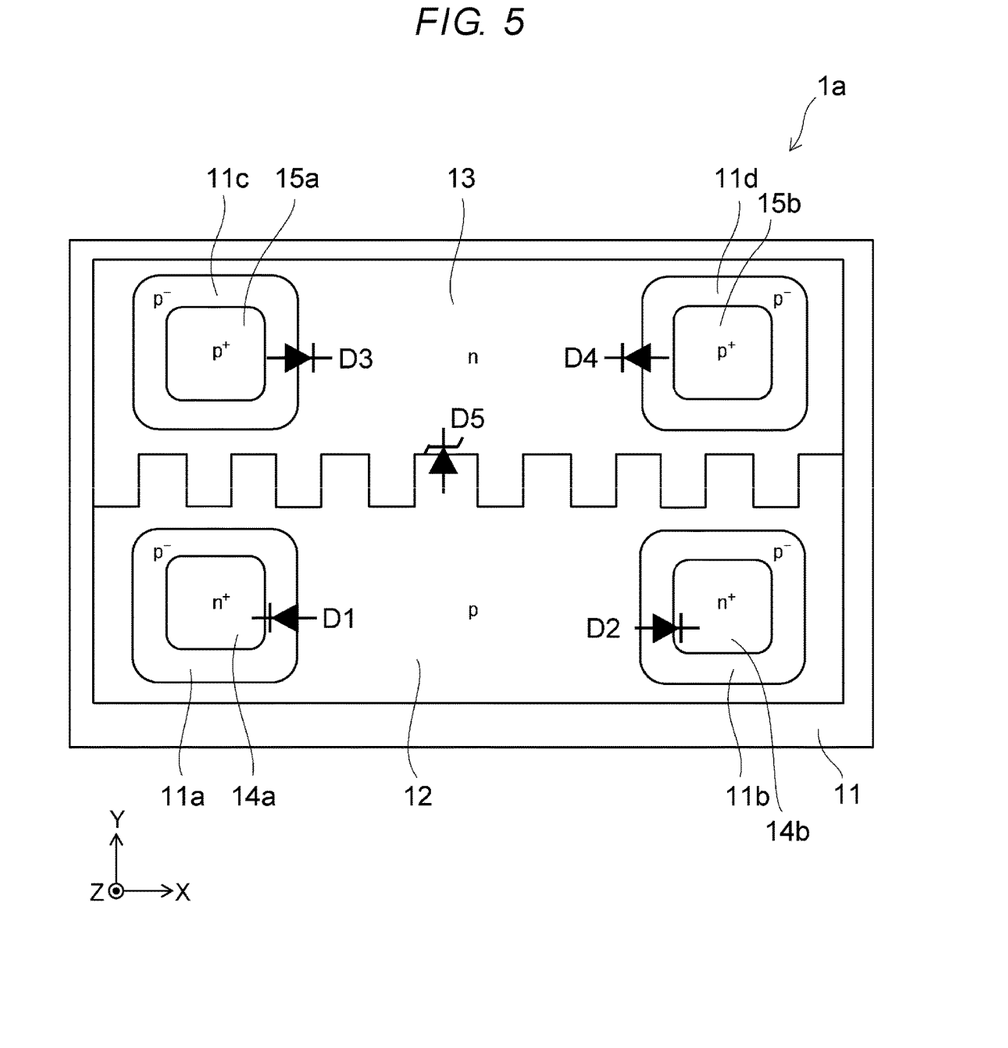
FIG. 5 is a plan view depicting a semiconductor device according to a modified example of the first embodiment.

FIG. 5 is a plan view depicting a semiconductor device according to the present modified example.

As depicted in FIG. 5, in a semiconductor device 1a according to the present modified example, when viewed from the Z direction, the interface between the p-type well 12 and the n-type well 13 has a comb-like shape. This increases the junction area of the diode D5 as compared to the semiconductor device 1 (see FIG. 2) according to the above-described first embodiment. As a result, an ESD tolerance is increased, and the dynamic resistance of the current paths Ia and Ib (see FIG. 4) is reduced.

As described above, according to the present modified example, as compared to the first embodiment, a semiconductor device with a higher ESD tolerance and lower dynamic resistance can be provided.

The capacitance of the diode D5 is increased as compared to the first embodiment; however, due to the structure of the above-described crowbar circuit, the capacitance between the electrode 18a and the electrode 18b increases very little.

In the above-described first embodiment and the modified example thereof, substantially the same effects can also be obtained by providing an n⁻-type epitaxial layer in place of the p⁻-type epitaxial layer 11. Moreover, the conductivity type of each region may be reversed. Also, in this case, the same effect as the effect of the first embodiment and the modified example thereof can be obtained.

Second Embodiment

Figure 6:
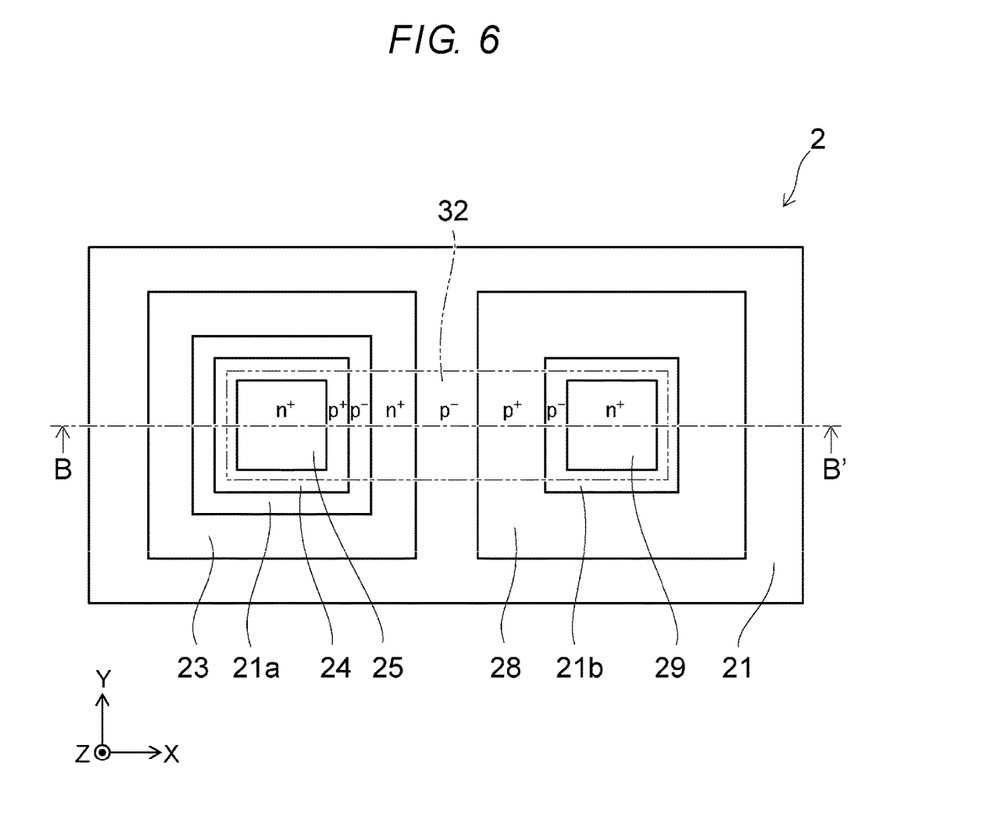
FIG. 6 is a plan view depicting a semiconductor device according to a second embodiment.

FIG. 6 is a plan view depicting a semiconductor device according to the second embodiment.

Figure 7:
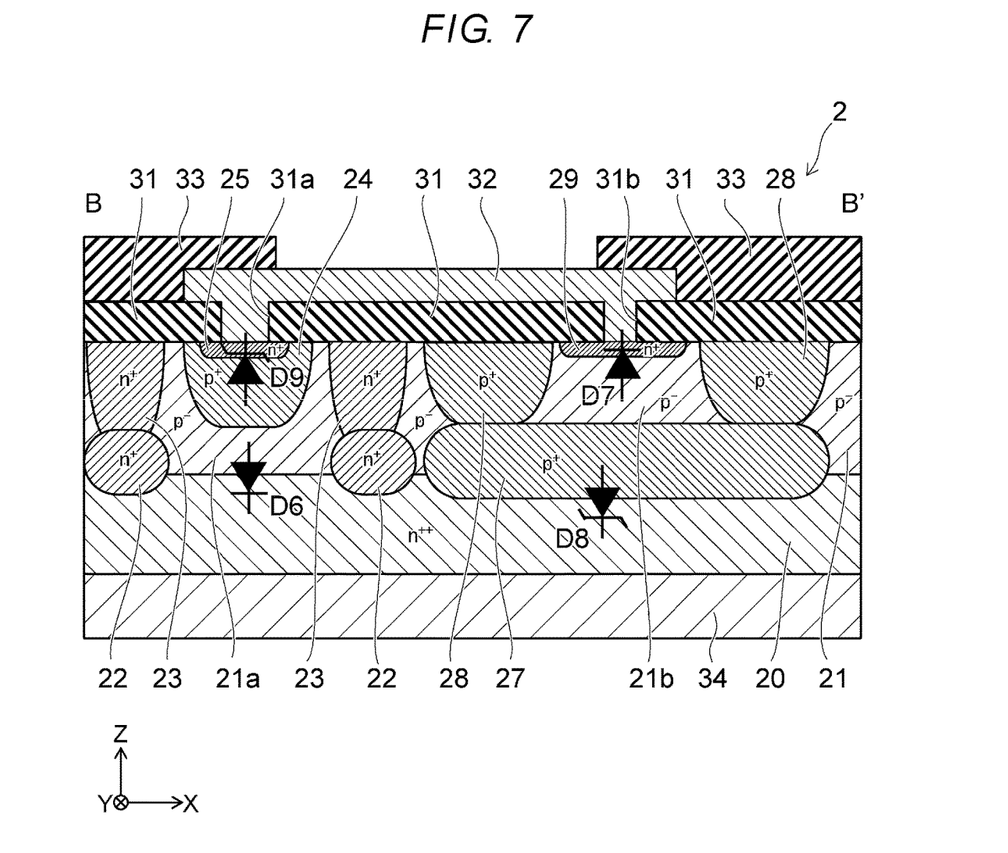
FIG. 7 is a cross-sectional view taken along the line B-B' depicted in FIG. 6.

FIG. 7 is a cross-sectional view taken along the line B-B' depicted in FIG. 6.

Figure 8:
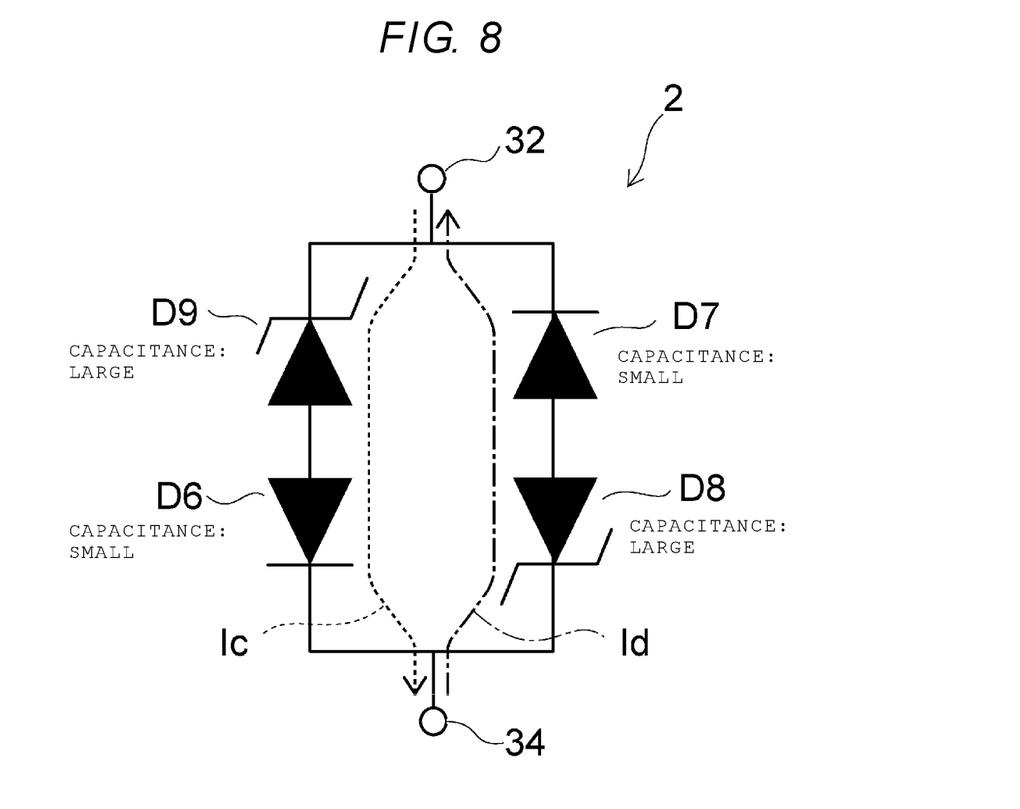
FIG. 8 is a circuit diagram depicting the semiconductor device according to the second embodiment.

FIG. 8 is a circuit diagram depicting the semiconductor device according to the second embodiment.

As depicted in FIGS. 6 and 7, in a semiconductor device 2 according to the second embodiment, an n⁺⁺-type substrate 20 is provided. An "n⁺⁺-type" indicates that this type contains a higher concentration of impurities acting as donors than the "n⁺-type". On the n⁺⁺-type substrate 20, a p⁻-type epitaxial layer 21 is provided.

In the upper portion of the n⁺⁺-type substrate 20 and the lower portion of the p-type epitaxial layer 21, an n⁺-type well 22 is provided over the interface between the n⁺⁺-type substrate 20 and the p⁻-type epitaxial layer 21. In a region immediately above the n⁺-type well 22, an n⁺-type well 23 is provided. The lower surface of the n⁺-type well 23 is in contact with the upper surface of the n⁺-type well 22. The upper surface of the n⁺-type well 23 reaches the upper surface of the p⁻-type epitaxial layer 21. When viewed from the Z direction, the n⁺-type wells 22 and 23 have a frame-like shape. Hereinafter, a portion of the p⁻-type epitaxial layer 21 that is surrounded by the n⁺-type wells 22 and 23 is referred to as a "p⁻-type epitaxial layer 21a". The p⁻-type epitaxial layer 21a is electrically separated from the surrounding p⁻-type epitaxial layer 21 by the n⁺⁺-type substrate 20 and the n⁺-type wells 22 and 23. In an upper portion of the central part of the p⁻-type epitaxial layer 21a, a p⁺-type well 24 is provided. In an upper portion of the central part of the p⁺-type well 24, an n⁺-type contact layer 25 is provided.

In a portion which is the upper portion of the n⁺⁺-type substrate 20 and the lower portion of the p⁻-type epitaxial layer 21 and is separated from the n⁺-type wells 22 and 23 in the X direction, a p⁺-type well 27 is provided. When viewed from the Z direction, the p⁺-type well 27 has a rectangular shape. In part of a region immediately above the p⁺-type well 27, a p⁺-type well 28 is provided. The lower surface of the p⁺-type well 28 is in contact with the upper surface of the p⁺-type well 27. The upper surface of the p⁺-type well 28 reaches the upper surface of the p⁻-type epitaxial layer 21. When viewed from the Z direction, the p⁺-type well 28 has the shape of a frame along the outer edge of the p⁺-type well 27. Hereinafter, in the p⁻-type epitaxial layer 21, a portion surrounded by the p⁺-type wells 27 and 28 is referred to as a "p⁻-type epitaxial layer 21b". In an upper portion of the central part of the p⁻-type epitaxial layer 21b, an n⁺-type contact layer 29 is provided. The n⁺-type wells 22 and 23 electrically separate the p⁻-type epitaxial layer 21a and the p⁺-type well 24 from the p⁺-type well 27 and the p⁻-type epitaxial layer 21b.

On the p⁻-type epitaxial layer 21, an insulating film 31 is provided. In the insulating film 31, two openings 31a and 31b are formed. Through the opening 31a, the central part of the n⁺-type contact layer 25 is exposed. Through the opening 31b, the central part of the n⁺-type contact layer 29 is exposed.

On the insulating film 31, an electrode 32 is provided. The electrode 32 is connected to the n⁺-type contact layer 25 via the opening 31a and connected to the n⁺-type contact layer 29 via the opening 31b. On the insulating film 31, an insulating film 33 is provided so as to cover the periphery (outer edge portion) of the electrode 32. The central part of the electrode 32 is not covered with the insulating film 33 and serves as a pad to be connected to the outside. In FIG. 6, for the purpose of illustration, the insulating films 31 and 33 are omitted from the depiction.

On the lower surface of the n⁺⁺-type substrate 20, an electrode 34 is provided and connected to the n⁺⁺-type substrate 20.

Next, an operation of the semiconductor device 2 according to the second embodiment will be described.

As was the case with the semiconductor device 1 (see FIGS. 1 to 4), the semiconductor device 2 can also be used as a protective circuit, for example.

As depicted in FIGS. 6 and 7, a diode D6 whose anode is the p⁻-type epitaxial layer 21a and whose cathode is the n⁺⁺-type substrate 20 is formed at the interface between the p⁻-type epitaxial layer 21a and the n⁺⁺-type substrate 20. A diode D7 whose anode is the p⁻-type epitaxial layer 21b and whose cathode is the n⁺-type contact layer 29 is formed at the interface between the p⁻-type epitaxial layer 21b and the n⁺-type contact layer 29.

A diode D8 whose anode is the p⁺-type well 27 and whose cathode is the n⁺⁺-type substrate 20 is formed at the interface between the p⁺-type well 27 and the n⁺⁺-type substrate 20. A diode D9 whose anode is the p⁺-type well 24 and whose cathode is the n⁺-type contact layer 25 is formed at the interface between the p⁺-type well 24 and the n⁺-type contact layer 25.

As depicted in FIG. 8, the semiconductor device operates as an equivalent circuit in which two bidirectional diodes are connected in parallel. In this circuit, the electrodes 32 and 34 and the diodes D6 to D9 are provided. The cathode of the diode D6 and the cathode of the diode D8 are connected to the electrode 34. The cathode of the diode D7 and the cathode of the diode D9 are connected to the electrode 32. The anode of the diode D6 is connected to the anode of the diode D9. The anode of the diode D7 is connected to the anode of the diode D8. Here, the diodes D8 and D9 are Zener diodes. The diodes D6 and D9 are electrically separated from the diodes D7 and D8 by the n⁺-type wells 22 and 23 (see FIG. 7).

Between the electrode 32 and the electrode 34, a current path that passes through all diodes in a forward direction does not exist, and a current passes through at least one diode in the reverse direction. While the anodes of the diodes D6 and D7 are the p⁻-type epitaxial layers 21a and 21b, respectively, the anodes of the diodes D8 and D9 are the p⁺-type wells 27 and 24, respectively. As a result, the depletion layers of the diodes D8 and D9, which are formed at the time of reverse junction, are narrower than the depletion layers of the diodes D6 and D7 and therefore the capacitance is large, and the breakdown voltage is low. Thus, the semiconductor device 2 can be designed so that the diode D8 breaks down before the diode D6 and the diode D9 breaks down before the diode D7 when a voltage is applied between the electrode 32 and the electrode 34.

As a result, when a voltage generated with the electrode 32 being used as a positive electrode and the electrode 34 as a negative electrode is applied, a current flows along a current path Ic: {the electrode 32→the diode D9 (reverse direction)→the diode D6 (forward direction)→the electrode 34}. On the other hand, when a voltage generated with the electrode 34 being used as a positive electrode and the electrode 32 as a negative electrode is applied, a current flows along a current path Id: {the electrode 34→the diode D8 (reverse direction)→the diode D7 (forward direction) →the electrode 32}.

In the current path Ic, since the diode D9 and the diode D6 are connected in series between the electrode 32 and the electrode 34, the large capacitance of the diode D9 is not visible from the outside. Likewise, in the current path Id, since the diode D8 and the diode D7 are connected in series between the electrode 34 and the electrode 32, the large capacitance of the diode D8 is not visible from the outside. As a result, the effective capacitance of the semiconductor device 2 is small.

Next, the effect of the second embodiment will be described.

In the semiconductor device 2 according to the second embodiment, bidirectional current paths Ic and Id can be provided in one chip. As a result, a bidirectional protective circuit can be provided at low cost and in small space.

Moreover, in the semiconductor device 2, the electrode 34 is provided on the lower side and the electrode 32 is provided on the upper side; however, since the current path Ic and the current path Id are circuits which are virtually equivalent to each other, the semiconductor device 2 can be mounted in many cases in a state in which the semiconductor device 2 is turned upside down. As a result, in many cases, the semiconductor device 2 can be mounted without differentiating between the upper and lower surfaces thereof.

Furthermore, in the semiconductor device 2, by respectively connecting the diodes D8 and D9 with a large capacitance and the diodes D6 and D7 with small capacitance in series, the effective capacitance between the electrode 32 and the electrode 34 can be made smaller.

Modified Example of the Second Embodiment

Next, a modified example of the second embodiment will be described.

Figure 9:
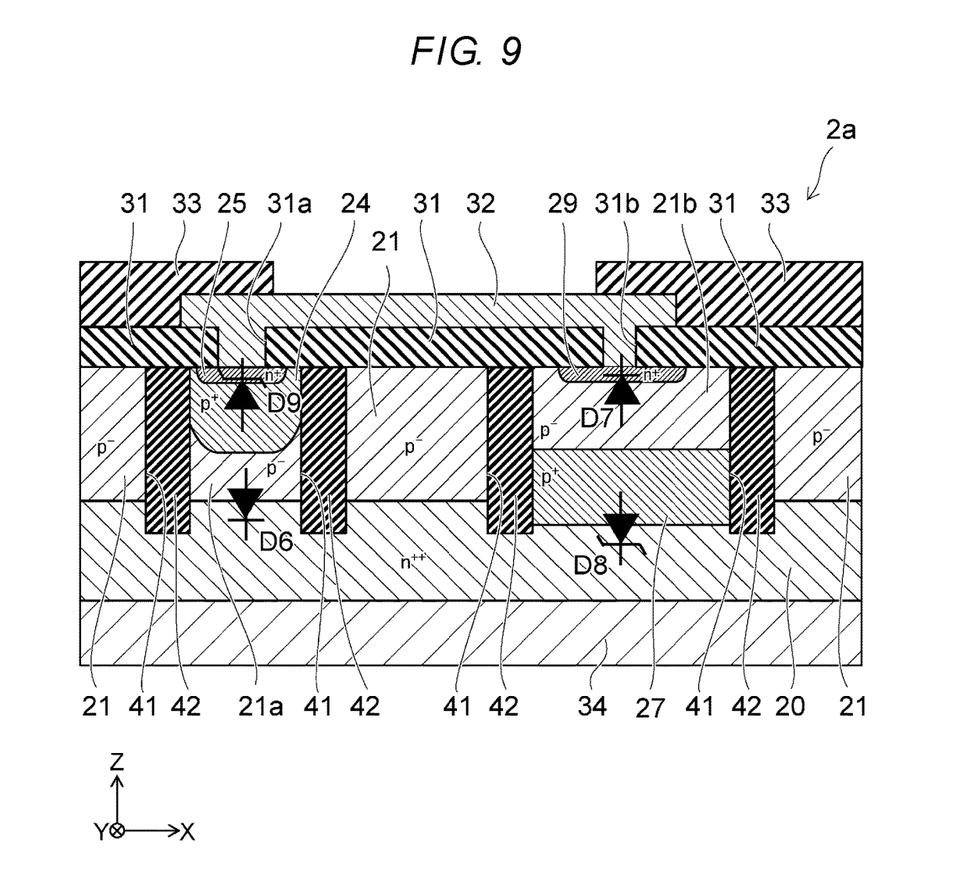
FIG. 9 is a cross-sectional view depicting a semiconductor device according to a modified example of the second embodiment.

FIG. 9 is a cross-sectional view depicting a semiconductor device according to the present modified example.

As depicted in FIG. 9, a semiconductor device 2a according to the present modified example differs from the semiconductor device 2 (see FIG. 7) in that the n⁺-type wells 22 and 23 and the p⁺-type well 28 are replaced with an insulating element 42 embedded in a trench 41. The insulating element 42 is formed of an insulating material such as silicon oxide, for example. The p⁻-type epitaxial layer 21a and the p⁺-type well 24 and the p⁺-type well 27 and the p⁻-type epitaxial layer 21b are electrically separated from each other by the insulating element 42. As a result, the current path Ic (including the diodes D6 and D9) and the current path Id (including the diodes D7 and D8) can be isolated from each other.

According to the present modified example, a process for forming the n⁺-type wells 22 and 23 and the p⁺-type well 28 can be omitted, and an element isolation area can be made smaller. As a result, the semiconductor device 2a can be made smaller, and the cost can be further reduced.

It is to be noted that, in the above-described second embodiment and the modified example thereof, the conductivity type of each region may be reversed. Also, in this case, the same effect as the effect of the second embodiment and the modified example thereof can be obtained.

According to the embodiments described above, a low-cost semiconductor device can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Furthermore, two or more of the above described embodiments may be combined.

What is claimed is:

1. A semiconductor device, comprising:
   a first diode having a cathode connected to a first terminal;
   a second diode having a cathode connected to a second terminal and an anode connected to an anode of the first diode;

a third diode having an anode connected to the first terminal and the cathode of the first diode;
a fourth diode having an anode connected to the second terminal and the anode of the second diode and a cathode connected to a cathode of the third diode; and
a fifth diode having an anode connected to the anode of the first diode and the anode of the second diode and a cathode connected to the cathode of the third diode and the cathode of the fourth diode, wherein
a breakdown voltage of the fifth diode is lower than a breakdown voltage of the first diode, a breakdown voltage of the second diode, a breakdown voltage of the third diode, and a breakdown voltage of the fourth diode.

2. The semiconductor device according to claim 1, wherein
the fifth diode is formed at an interface of a first well of a first conductivity type and a second well of a second conductivity type,
the first diode is formed at an interface between a first layer and a second layer, the first layer being adjacent to the first well and having the first conductivity type and an impurity concentration that is lower than an impurity concentration of the first well, the second layer being connected to the first terminal and having the second conductivity type,
the second diode is formed at an interface between a third layer and a fourth layer, the third layer being adjacent to the first well and having the first conductivity type and an impurity concentration that is lower than the impurity concentration of the first well, and the fourth layer being connected to the second terminal and having the second conductivity type,
the third diode is formed at an interface between a fifth layer and the second well, the fifth layer being connected to the first terminal and having the first conductivity type and an impurity concentration that is lower than the impurity concentration of the first well, and
the fourth diode is formed at an interface between a sixth layer and the second well, the sixth layer being connected to the second terminal and having the first conductivity type and an impurity concentration that is lower than the impurity concentration of the first well.

3. The semiconductor device according to claim 2, wherein the interface between the first well and the second well has a comb-like shape.

4. The semiconductor device according to claim 3, further comprising:
an intrinsic semiconductor layer, wherein
the first well, the second well, the first layer, the third layer, the fifth layer, and the sixth layer are disposed on the intrinsic semiconductor layer and contacting the intrinsic semiconductor layer.

5. The semiconductor device according to claim 2, further comprising:
an intrinsic semiconductor layer, wherein
the first well, the second well, the first layer, the third layer, the fifth layer, and the sixth layer are disposed on the intrinsic semiconductor layer and contacting the intrinsic semiconductor layer.

6. The semiconductor device according to claim 2, wherein
the first well surrounds the first layer, the second layer, the third layer, and the fourth layer, and
the second well surrounds the fifth layer, the sixth layer.

7. The semiconductor device according to claim 6, wherein the first terminal comprises a first conductive layer disposed on an insulating layer above the interface between the first and second wells, and
the second terminal comprises a second conductive layer that is spaced from the first conductive layer and disposed on the insulating layer above the interface between the first and second wells.

8. The semiconductor device according to claim 1, wherein the fifth diode is a Zener diode.

9. A semiconductor device, comprising:
a first well of a first conductivity type;
a second well having a second conductivity type and contacting the first well;
a first layer contacting the first well and having the first conductivity type and an impurity concentration is lower than an impurity concentration of the first well;
a second layer contacting the first layer and connected to a first electrode, the second layer having the second conductivity type;
a third layer contacting the first well and having the first conductivity type and an impurity concentration that is lower than the impurity concentration of the first well;
a fourth layer contacting the third layer and connected to the second electrode, the fourth layer having the second conductivity type;
a fifth layer contacting the second well and connected to the first electrode, the fifth layer having the first conductivity type and an impurity concentration that is lower than the impurity concentration of the first well; and
a sixth layer contacting the second well and connected to the second electrode, the sixth layer having the first conductivity type and an impurity concentration that is lower than the impurity concentration of the first well.

10. The semiconductor device according to claim 9, wherein the interface between the first well and the second well has a comb-like shape.

11. The semiconductor device according to claim 10, further comprising:
an intrinsic semiconductor layer, wherein
the first well, the second well, the first layer, the third layer, the fifth layer, and the sixth layer are disposed on the intrinsic semiconductor layer and contacting the intrinsic semiconductor layer.

12. The semiconductor device according to claim 9, further comprising:
an intrinsic semiconductor layer, wherein
the first well, the second well, the first layer, the third layer, the fifth layer, and the sixth layer are disposed on the intrinsic semiconductor layer and contacting the intrinsic semiconductor layer.

13. The semiconductor device according to claim 9, wherein
the first well surrounds the first layer, the second layer, the third layer, and the fourth layer, and
the second well surrounds the fifth layer, the sixth layer.

14. The semiconductor device according to claim 9, wherein
the first electrode comprises a first conductive layer disposed on an insulating layer above the interface between the first and second wells, and
the second electrode comprises a second conductive layer that is spaced from the first conductive layer and disposed on the insulating layer above the interface between the first and second wells.

15. The semiconductor device according to claim 9, wherein the fifth diode is a Zener diode.

16. A semiconductor device, comprising:
a first diode having a cathode connected to a first terminal;
a second diode having a cathode connected to a second terminal;
a third diode having a cathode connected to the first terminal and an anode connected to an anode of the second diode, the third diode having a capacitance that is lower than a capacitance of the second diode; and
a fourth diode having a cathode connected to the second terminal and an anode connected to an anode of the first diode, the fourth diode having a capacitance that is lower than a capacitance of the first diode.

17. The semiconductor device according to claim 16, wherein
the first diode is formed at an interface between a first layer and a second layer, the first layer being electrically connected to the first terminal and of a first conductivity type, the second layer being of a second conductivity type,
the second diode is formed at an interface between a third layer of the second conductivity type and a fourth layer of the first conductivity type, the fourth layer being electrically connected to the second terminal,
the third diode is formed at an interface between the first layer and a fifth layer having the second conductivity type, the fifth layer being connected to the third layer and having an impurity concentration that is higher than an impurity concentration of the third layer,
the fourth diode is formed at an interface between a sixth layer and a seventh layer, the sixth layer being adjacent to the second layer and of the second conductivity type and having an impurity concentration that is higher than an impurity concentration of the second layer, the seventh layer being electrically connected to the second terminal and having the first conductivity type, and
the second layer and the third layer are electrically separated from each other.

18. The semiconductor device according to claim 17, further comprising:
an eighth layer between the second layer and the third layer and having the first conductivity type.

19. The semiconductor device according to claim 17, further comprising:
an insulating element between the second layer and the third layer.

20. The semiconductor device according to claim 19, wherein the insulating element is silicon dioxide.

* * * * *